United States Patent [19]
Clark

[11] 3,948,108
[45] Apr. 6, 1976

[54] GUIDE AND KEY ASSEMBLY FOR A PUSHBUTTON RADIO RECEIVER

[75] Inventor: Alfred J. Clark, Palatine, Ill.

[73] Assignee: Motorola, Inc., Chicago, Ill.

[22] Filed: Dec. 31, 1974

[21] Appl. No.: 537,725

[52] U.S. Cl. ............. 74/10.33; 74/10.29; 74/10.35; 334/7
[51] Int. Cl.² ........................................ F16H 35/18
[58] Field of Search............ 74/10.33, 10.35, 10.37, 74/10.29, 10.39; 334/7

[56] References Cited
UNITED STATES PATENTS

| | | | |
|---|---|---|---|
| 2,266,711 | 12/1941 | Crosby et al........................ | 74/10.33 |
| 2,310,003 | 2/1943 | Wells................................. | 74/10.33 |
| 3,680,394 | 8/1972 | Thompson............................. | 334/7 |
| 3,835,713 | 9/1974 | Olah.................................. | 74/10.33 |
| 3,854,342 | 12/1974 | Smith................................. | 74/10.33 |

*Primary Examiner*—Samuel Scott
*Assistant Examiner*—Randall Heald
*Attorney, Agent, or Firm*—James W. Gillman; Donald J. Lisa

[57] ABSTRACT

Upon pushbutton depression, a face in the key slot of a button slide forcibly engages the T lug extending from a tuner slide, thereby translating the tuner slide. Coupled to the tuner slide is a memory cam the angular position of which is presettable, corresponding to a desired receiver tuning. The cam is forced to engagement with a tuning mechanism which senses the angular position of the cam and tunes the receiver accordingly. The face is predeterminedly curved, and the vertical height of the slot so dimensioned, to decouple vertical deflections of the button slide from the tuner slide, thus minimizing deviations of the cam from its preselected position. When mounted in a chassis, the chassis is provided with a guide detail which further minimizes vertical deflection of the tuner slide.

7 Claims, 4 Drawing Figures

U.S. Patent April 6, 1976 3,948,108
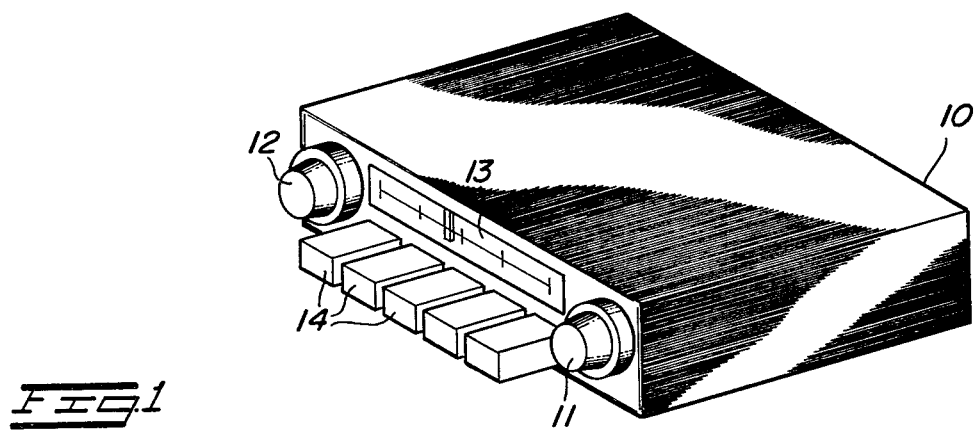
FIG. 1
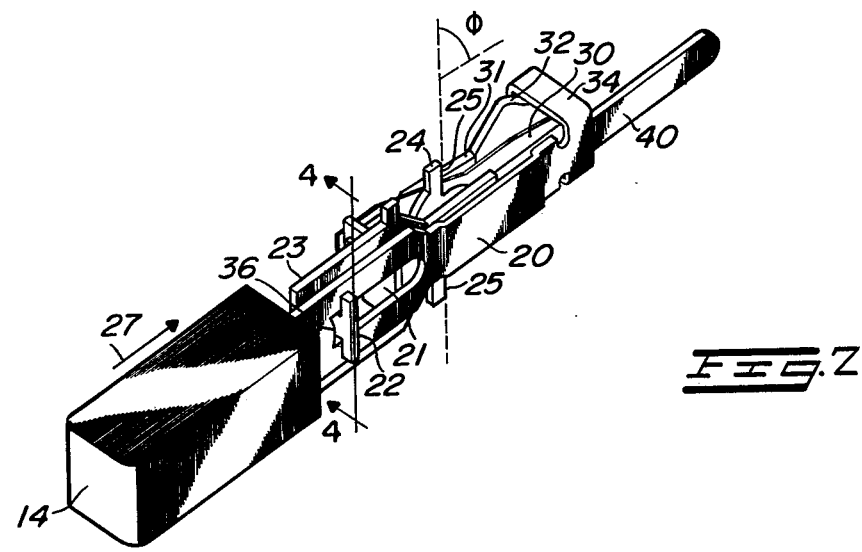
FIG. 2
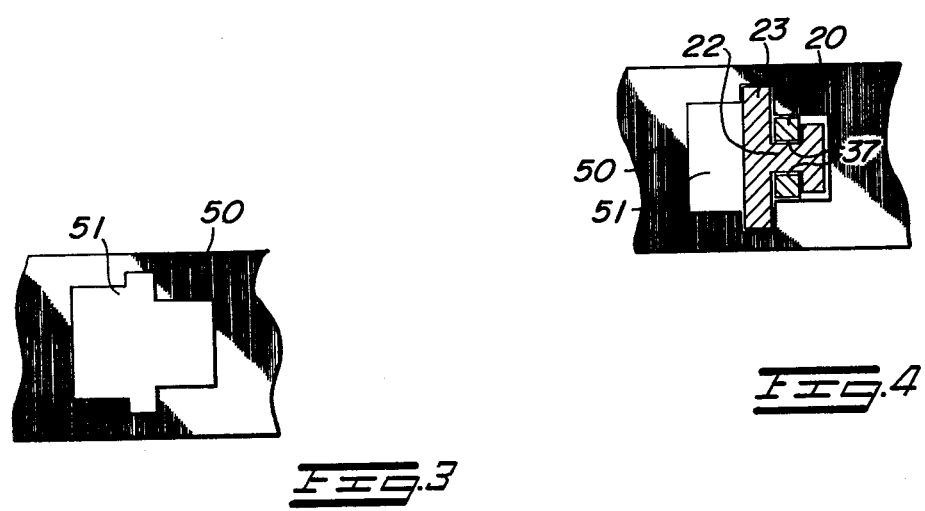
FIG. 3
FIG. 4

GUIDE AND KEY ASSEMBLY FOR A PUSHBUTTON RADIO RECEIVER

BACKGROUND OF THE INVENTION

The invention relates to mechanisms for pushbutton tuning of radio receivers and more particularly to improved keyslides and guides thereto.

Automatic pushbutton tuning of radio receivers using keyslide mechanisms are well known in the art. A detailed description of the operation of such mechanisms is given in U.S Pat. No. 3,195,359 to Alfred J. Clark. Briefly, a pushbutton radio is provided with a plurality of pushbuttons, each of which when depressed corresponds to a desired tuning of the radio receiver. The pushbutton connects to a button slide which is provided with a key slot. slideably fitted into the key slot is a T lug which extends from a tuner slide. The tuner slide couples to a memory cam which has opposing engaging faces.

To program a desired pushbutton tuning, the pushbutton is pulled outwardly from the radio receiver which releases the frictional forces maintaining the angular position of the cam. The receiver is then tuned manually to the desired frequency which rotates a treadle bar assembly having parallel rods constrained to move about an axis, which assembly couples to a movable carriage. The carriage relocates slugs within tuned coils which constitute the variable tuning element of the receiver. When the button is then depressed the opposing faces of the cam engage and align with the angular position of the treadle rods. Further pushbutton depression frictionally locks the angular position of the memory cam in the preselected position. Subsequent depression of the pushbutton will cause the face of the key slot to forcibly engage the T lug on the tuner slide thus forcing the slide and the cam against the treadle rods and aligning the rods to the angular position of the cam, thereby returning the radio receiver to the desired frequency.

As receiver tuning is dependent upon the angle to which the memory cam rotates the treadle bar assembly, maintaining angular position of the cam becomes quite critical. Errors in tuning can come about as a result of undesired movements of the cam. For example, in conventional pushbutton key-slide mechanisms, should the pushbutton be vertically deflected when it is depressed, the cam will be similarly deflected, causing an improper angular rotation of the treadle bar assembly and resultant receiver mistuning. As receivers are becoming miniaturized, the problems with undesired movements due to component tolerances becomes heightened.

SUMMARY OF THE INVENTION

Accordingly, it is an object of the present invention to provide an improved keyslide mechanism which decouples unwanted pushbutton deflections from the tuning mechanism.

It is a further object of the present invention to improve the guides in conventional tuning mechanisms to further minimize undesired tuning mechanism deflections.

A further object of the present invention is to provide keyslide and tuning mechanisms as above described which require a simple modification to existing keyslide and guide mechanisms.

Briefly, a depressible pushbutton causes horizontal translation of a button slide coupled thereto. The button slide is provided with a key slot which has vertical and horizontal dimensions, and an engaging face located on the forward, i.e. outward, vertical dimension. The button slide couples to a tuner slide via a flanged, or T-shaped lug extending from the tuner slide and sliding in the key slot. Button depression causes the outward face on the key slot to forcibly engage the T-lug, which results in horizontal translation of the tuner slide. Coupled to the tuner slide is a memory cam which is presettably located at an angular position representative of desired receiver tuning.

Deviations from the presettable position of the memory cam are minimized by making the outward engaging face of a predetermined curvature such that the face, on engaging the T-lug, has a minimum of surface contact with, and thereby transfers a minimum vertical deflection to, the tuner slide. Also, the vertical dimension of the key slot is considerably larger than the connecting portion of the T-lug and allows a vertical deflection of the button slide with respect to the tuner slide thus similarly reducing unwanted deflections to the memory cam.

When used as part of a tuning mechanism, the keyslide is mounted in support means which include a guide detail for supportably guiding the button slide and tuner slide therein. The guide detail is a predetermined dimension minimizing the unwanted vertical deflection of the tuner slide upon pushbutton depression.

DESCRIPTION OF THE DRAWINGS

FIG. 1 illustrates a conventional radio receiver provided with a plurality of pushbuttons;

FIG. 2 is a perspective of a keyslide mechanism;

FIG. 3 is a front elevation illustrating the guide detail on the front panel of the receiver according to the invention; and FIG. 4 is a cross-sectional view through the T-lug illustrating the guide detail of FIG. 3 with the tuner slide and button slide located therein, according to the invention.

DETAILED DESCRIPTION OF THE PREFERRED EMBODIMENT OF THE INVENTION

FIG. 1 illustrates a conventional pushbutton radio receiver 10 having a manual tuning knob 11, a volume control knob 12, a dial plate and pointer 13 and a plurality of pushbuttons 14. The on/off switch to the unit is normally coupled to the volume control knob 12, which knob allows continuous control of audio level from the receiver. Tuning the manual tuning knob, repositions the pointer with respect to the dial scale 13 and simultaneously alters the position of slugs within tuned coils in the receiver to vary the tuning of the receiver. The reading on the dial scale 13 opposite the pointer corresponds to the frequency to which the receiver is tuned. Tuning may also be accomplished by depression of any one of the pushbuttons 14. The pushbuttons 14 couple to presettable tuning mechanisms which automatically tune the receiver to a desired frequency on depression of the corresponding pushbutton.

One of the pushbuttons of FIG. 1 is shown with its corresponding keyslide assembly in FIG. 2. The pushbutton 14 is mechanically affixed to the pushbutton slide 20. The slide is provided with a key slot 21. Shown riding in the key slot 21 is a T-shaped lug 22 which is removably fitted into the key slot and is slideable therein. The T-lug 22 is formed at right angles, and affixed, to a tuner slide 23. Coupled to the tuner slide 23 is a memory cam 24 which is substantially semicircular in shape and is provided with opposed engaging faces 25. The cam 24 is centrally located on a pivot (not shown) on the tuner slide, and, when unlocked is free to pivot thereon, creating a cam face angle $\phi$ as measured with respect to the direction of movement of the pushbutton 27.

Also located on the tuner slide 23 is a spring 30 and a locking lever 31. The locking lever 31 has a raised portion 32 which the spring 30 tends to bias away from the tuner slide 23 but in the same horizontal plane. Fitted to the interior of pushbutton slide 20 is a locking portion 34 which rides over the raised portion 32 of the locking lever 31.

Programming the angle of the memory cam to a desired position is accomplished as follows. The pushbutton 14 is pulled outward in a direction directly opposite to the arrow 27. As the T lug 22 is free to ride in the key slot 21 the tuner slide 23 remains stationary. However, the locking portion 34 rides over and passes the locking lever raised portion 32, thus allowing spring 30 to bias the locking lever outward from the tuner slide 23. With the locking lever thus released the memory cam 24 is free to rotate about its pivot to a variable angle. At this point, the receiver is manually tuned to the frequency to which this pushbutton will thereafter correspond. Manual tuning of the receiver via the manual tuning knob 11 simultaneously repositions tuned slugs within tuneable cores in the receiver and positions a treadle rod assembly coupled to the movable carriage of the tuned slugs. The treadle bar assembly consists of a pair of parallel rods constrained to rotate about an axis, which axis is perpendicular to the direction of travel of the pushbutton 27. The angular position of the surface formed by the two rods and their central axis is representative of the tuning of the radio receiver as is the angular position of the cam as above described.

The button is now depressed in a direction 27. While the tuner slide 23 was stationary when the button was pulled out, the action of the spring 30 forcing the locking lever 32 outward causes the locking portion 34 to forcibly engage the raised portion 32 coupling the tuner slide to the pushbutton slide and resulting in the tuner slide moving in the depressible direction 27 along with the pushbutton slide. As the pushbutton is depressed, the cam faces 25 engage the rods of the treadle bar assembly aligning themselves with the angle thereat. Since the treadle bar rods are constrained to rotate and not translate, the cam and tuner slide are constrained from any further directional movement. Thereafter, further pushbutton force causes the locking portion 34 to ride back over the raised portion 32 resulting in the locking lever 31 frictionally pinching the cam resulting in a locked cam position.

When pushbutton pressure is released, a spring (not shown) which rides over extended finger 40 of tuner slide 23 biases the keyslide opposite the direction of depression 27 back to a reset position.

Subsequently, when the pushbutton 14 is depressed, the engaging face 36 which is formed on the forward vertical dimension of the key slot 21 forcibly engages the connecting portion of the T-lug 22, the tuner slide 23 is translated in the direction of depression 27 causing the opposing faces 25 of the memory cam 24 to engage and rotate the treadle rod assembly to the angle $\phi$. The treadle assembly rotation couples to the carriage for the tuning slugs retuning the radio receiver to the frequency dictated by the angular position of the memory cam.

When the cam 24 is forcibly engaging the rods of the treadle bar assembly, any vertical deflection of the cam will cause a further rod rotation, albeit slight. This further rotation would constitute a deviation from the angular position of the cam thus resulting in mistuning of the radio receiver. A likely source for a vertical deflection of the tuner slide and thus the memory cam is the pushbutton. That is, it is likely that when the user depresses the pushbutton, his finger will impart a vertical component as well as a horizontal component to the pushbutton. A preferred embodiment of the invention, incorporates a predeterminedly curved engaging face 36 on the outward edge of the key slot 21. The curve is formed from a radius whose center point is located on the longitudinal axis, and in the forward direction of the keyslide 21. Thus, contact between the engaging face 36 and the T-lug 22 occurs at the central portion of the key slot face and the lug surface. Surface contact and vertical frictional forces are thus minimized. Any vertical deflection of the pushbutton and button slide will couple a relatively small vertical deflection to the tuner slide as opposed to a large vertical coupling from a conventional straight edged engaging face.

Another drawback to the keyslide mechanism of the prior art was that in the normal position the key slot 21 vertical dimension created a very close fit between the button slide and the connecting portion of the T-lug forcibly coupling the two together. A keyslide according to the invention has a button slide 20 which is provided with a key slot 21 providing a clearance between these parts. That is, slot 21 has a vertical dimension which allows vertical deflection of the button slide with respect to the tuner slide. This feature is better shown in FIG. 4 where clearance 37 is apparent.

When the keyslide is located within the radio receiver, support is provided to the keyslide via the chassis including the front panel having a guide detail as illustrated in FIG. 3. Shown is a cut out of the front panel 50 provided with guide detail 51 wherein the button slide and tuner slide are supportably guided. Whereas guide details in the prior art allow considerable vertical movement of the tuner slide, the guide detail according to the invention minimizes such vertical deflection.

Referring to FIG. 4, the keyslide mechanism of FIG. 2 cut in the cross-sectional plane at 4 is shown located within the guide detail of FIG. 3. As can be seen from the figure, the guide detail fits snugly to the vertical extremes of the tuner slide 23 thus restricting any vertical deflections of the slide to a minimum. Further, it can be seen that the vertical dimension of the key slot 21 provided within the button slide 20 allows a gap 37 on either side of the connecting portion of T-lug 22 of tuner slide 23 such that a vertical deflection of the button slide is not coupled to the tuner slide.

In summary, mistuning due to vertical deflections of the memory cam in a keyslide mechanism have been reduced according to the improvement of the invention.

While a preferred embodiment of the invention has been illustrated, countless other embodiments are possible all of which would fall within the true spirit and scope of the invention.

I claim:

1. A keyslide mechanism for a pushbutton automotive radio receiver including in combination
   a depressible pushbutton coupled to a button slide movable in a substantially horizontal plane, the slide provided with a key slot having vertical and horizontal dimensions and an engaging face of predetermined curvature located on the outward vertical dimension,
   a tuner slide having a T-shaped lug, the lug, located in the key slot and horizontally slideable therein, forcibly engaged by the engaging face upon pushbutton depression,
   the vertical dimension of the key slot allowing vertical deflection of the button slide with respect to the tuner slide upon pushbutton depression, and
   a memory means, presettably located at a position representative of desired receiver tuning, coupled to the tuner slide.

2. The mechanism of claim 1 wherein the predetermined engaging face is of a given radius, whose center point is located on the longitudinal axis of and a forward position to the key slot.

3. The keyslide mechanism of claim 1 supportably mounted by a supporting means including a front guide for supportably guiding the button and tuner slides therein.

4. The mechanism of claim 3 wherein the guide detail is of predetermined dimension minimizing the vertical deflection of the tuner slide upon pushbutton depression.

5. A keyslide mechanism for a pushbutton automotive radio receiver including in combination
   a depressible pushbutton coupled to a button slide movable in a substantially horizontal plane, the slide provided with a key slot having vertical and horizontal dimensions and an engaging face located on the outward vertical dimension
   a tuner slide having a T-shaped lug, the lug, located in the key slot and horizontally slideable therein, forcibly engaged by the engaging face upon pushbutton depression, and
   a memory means, presettably located at a position representative of desired receiver tuning, coupled to the tuner slide,
   wherein the improvement comprises
   the engaging face of predetermined curvature to transmit a minimal vertical button slide deflection to the tuner slide,
   the vertical dimension of the key slot providing vertical deflection of the button slide with respect to the tuner slide.

6. A pushbutton tuning mechanism for an automotive radio receiver including in combination
   a depressible pushbutton coupled to a button slide movable in a substantially horizontal plane, the slide provided with a key slot having vertical and horizontal dimensions and an engaging face of predetermined curvature located on the forward vertical dimension,
   a tuner slide having a flanged T lug, the lug, located in the key slot and horizontally slideable therein, forcibly engaged by the engaging face upon pushbutton depression,
   the vertical dimension of the key slot providing vertical deflections of the button slide with respect to the tuner slide upon pushbutton depression,
   a memory means, presettably located at a position representative of desired receiver tuning, coupled to the tuner slide,
   tuning means forcibly engaged by the memory means upon pushbutton depression and tuning the receiver in response to the position thereof, and
   a supporting means including a front guide detail for supportably guiding the button slide and tuner slide therein, the guide detail of predetermined dimension minimizing the vertical deflection of the tuner slide upon pushbutton depression.

7. The mechanism of claim 6 wherein the predetermined engaging face is of a given radius, whose center point is located on the longitudinal axis of and a forward position to the key slot.

* * * * *

UNITED STATES PATENT AND TRADEMARK OFFICE
CERTIFICATE OF CORRECTION

PATENT NO. : 3,948,108
DATED : April 6, 1976
INVENTOR(S) : Alfred J. Clark

It is certified that error appears in the above–identified patent and that said Letters Patent are hereby corrected as shown below:

Column 1, line 17, the word "slideably" should be changed to --Slideably--

Column 1, line 40, the word "returning" should be changed to --retuning--

Column 3, line 61, the word "reset" should be changed to --rest--

Signed and Sealed this

Thirty-first Day of August 1976

[SEAL]

Attest:

RUTH C. MASON
*Attesting Officer*

C. MARSHALL DANN
*Commissioner of Patents and Trademarks*